United States Patent [19]

Wilber et al.

[11] Patent Number: 5,338,943
[45] Date of Patent: Aug. 16, 1994

[54] MAGNETIC FLUX-ENHANCED CONTROL LINE FOR SUPERCONDUCTING FLUX FLOW TRANSISTOR

[75] Inventors: William Wilber, Neptune; Roland Cadotte, Jr., Freehold, both of N.J.; Adam Rachlin, Germantown, Md.; Michael Cummings, Howell, N.J.

[73] Assignee: The United States of America as represented by the Secretary of the Army, Washington, D.C.

[21] Appl. No.: 115,502

[22] Filed: Sep. 1, 1993

[51] Int. Cl.$^5$ .................... H01L 39/22; H03K 3/38
[52] U.S. Cl. ................... 505/193; 257/36; 257/34; 307/306; 307/245; 307/541; 505/853; 505/865
[58] Field of Search ............. 257/34, 36–39; 307/306, 245, 541; 505/1, 700, 701, 702, 853, 855, 865, 873, 874

[56] References Cited

U.S. PATENT DOCUMENTS

| | | | |
|---|---|---|---|
| 3,764,863 | 10/1973 | Zappe | 505/874 |
| 5,019,721 | 5/1991 | Martens et al. | 257/34 |
| 5,229,655 | 7/1993 | Martens et al. | 257/31 |

FOREIGN PATENT DOCUMENTS

| | | | |
|---|---|---|---|
| 60-187071 | 9/1985 | Japan | 505/874 |
| 4184983 | 7/1992 | Japan | 257/34 |

OTHER PUBLICATIONS

Rajeevakumar, "A Josephson Vortex-Flow Device." Appl. Phys. Lett. vol. 39, No. 5, 1 Sep. 1981, pp. 439–441.

"S-Parameter Measurements and Application for Superconducting Flux Flow Transistors", J. S. Martens et al., 1991, IEEE MTT-S Digest, pp. 1231–1234.

"Characteristics of Superconducting Flux-Flow Transistors", G. K. G. Hohenwarter et al., Mar. 1991, IEEE Transactions on Magnetics, vol. 27, No. 2, pp. 3297–3300.

"The Universal Magnetic Field Dependence of the Critical Current Density in High-$T_e$ Ceramics", Fisher et al. and Properties of Critical Current Density in Heterostructures of $Y_1Ba_2Cu_3O_{7-y}/Y_1Ba_2(Cu_{1-x}Ni_x)_3O_{7-y}$ Superconducting Films, both in AIP Conference Proceedings 251, Superconductivity and Its Applications, American Institute of Physics, 1992.

"Thin Film Processing and Device Fabrication in the Tl-Ca-Ba-Cu-O System", J. S. Martens et al., Progress in High-Temperature Superconducting Transistors and Other Devices-SPIE vol. 1394, pp. 140–149.

*Primary Examiner*—Rolf Hille
*Assistant Examiner*—Mahshid Saadat
*Attorney, Agent, or Firm*—Michael Zelenka; William H. Anderson

[57] ABSTRACT

A magnetic flux-enhanced control line for a superconducting flux flow transistor (SFFT). The SFFT includes a pair of superconducting electrodes which provide a voltage output, a region of weakened superconductor connecting the electrodes and a control line. The region of weakened superconductor carries a current $I_{body}$ and the control line carries a current $I_{Control}$. The control line further has a portion thereof proximate the weakened region for providing a localized magnetic field through the weakened region as a function of $I_{Control}$. The magnetic flux through the weakened region induces vortices therein which have a resistance $r_o$. The proximate portion of the control line forms a tortuous current path whereby the magnetic flux through the weakened region is increased for increasing $r_o$ so that the output voltage of the transistor is increased without increasing $I_{Control}$.

4 Claims, 1 Drawing Sheet

MAGNETIC FLUX-ENHANCED CONTROL LINE FOR SUPERCONDUCTING FLUX FLOW TRANSISTOR

GOVERNMENT INTEREST

The invention described herein may be manufactured, used, and licensed by or for the Government of the United States of America without the payment to us of any royalty thereon.

FIELD OF THE INVENTION

This invention relates in general to superconducting flux flow transistors having a region of weakened superconducting links and, particularly, to an improved control line for enhancing magnetic flux through the weakened region of the superconducting flux flow transistor.

BACKGROUND OF THE INVENTION

Superconducting flux flow transistors (SFFT) are active four terminal devices exhibiting very high speed operation and a large gain which makes such transistors suitable for many applications. Conventional superconducting flux flow transistors are disclosed by J. S. Martens et al. in "S-Parameter Measurements and Application of Superconducting Flux Flow Transistors", 1991, *IEEE MTT-S Digest*, pp. 1231–34, and by G. K. G. Hohenwarter et al. in "Characteristics of Superconducting Flux-Flow Transistors", March 1991, *IEEE Transactions on Magnetics*, Vol. 27, No. 2, pp. 3297–3300. The entire disclosures of both of these references are incorporated herein by reference.

Superconducting flux flow transistors may be used as the active element in various devices including amplifiers, oscillators and mixers. A magnetic field generated by current in a control line controls operation of the transistor similar to a field effect transistor which is controlled by an electric field. The output or terminal voltage varies with respect to the magnitude of current in the transistor's control line. In a conventional superconducting flux flow transistor, the configuration of the control line is an inefficient manner of increasing the output or terminal voltage.

SUMMARY OF THE INVENTION

Accordingly, an object of the present invention is to provide a superconducting flux flow transistor having an improved control line permitting greater gain for the transistor.

Another object of the present invention is to provide a transistor which permits generating an increased magnetic field through a weakened region of superconductor without increasing the control line current.

These and other objects of the invention are achieved by a superconducting flux flow transistor which has a pair of superconducting electrodes that provide a voltage output, a region of weakened superconductor connecting the electrodes and a control line. The region of weakened superconductor carries a current $I_{body}$ and the control lines carries a current $I_{Control}$. The control line further has a portion thereof proximate the weakened region for providing a localized magnetic field through the weakened region as a function of $I_{Control}$. The magnetic flux through the weakened region induces vortices therein which create a resistance $r_o$. The proximate portion of the control line forms a tortuous current path whereby the magnetic flux density is increased through the weakened region thereby increasing $r_o$. As such, the output voltage of the transistor is increased without increasing $I_{Control}$.

Alternatively, the invention may comprise various other systems and methods. Other objects and features will be in part apparent and in part pointed out hereinafter.

BRIEF DESCRIPTION OF THE DRAWINGS

Some of the elements of the Figures have not been drawn to scale for purposes of illustrating the invention. Typical dimensions for the invention are given in the Detailed Description of the Invention. Moreover, corresponding reference characters indicate corresponding parts throughout the drawings.

DETAILED DESCRIPTION

Figure 1:
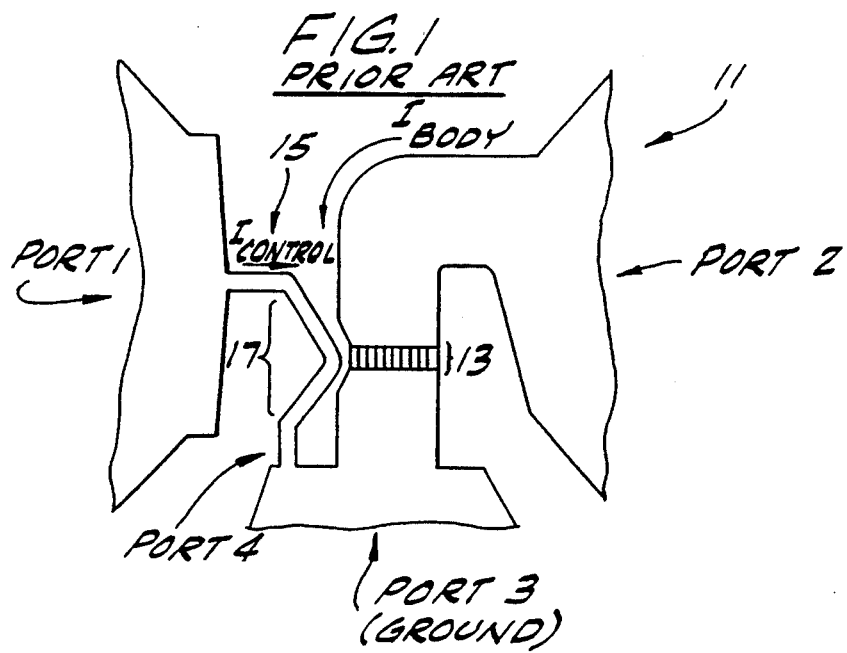
FIG. 1 is a partial and fragmentary plan view of a prior art superconducting flux flow transistor having a control line proximate a weakened region.

FIG. 1 shows a conventional Abrikosov vortex flow transistor, or superconducting flux flow transistor (SFFT) 11. The SFFT 11 may be used as the active element in various devices including amplifiers, oscillators and mixers. A magnetic field controls operation of SFFT 11 similar to an electric field controlling a field effect transistor.

As shown in FIG. 1, SFFT 11 has four terminals, ports 1–4. Typically, ports 3 and 4 are commonly connected to ground. A region 13 of weakened superconductor, also referred to as a "weak link" region, impedes a current $I_{body}$ between ports 2 and 3. All of SFFT 11 is comprised of high temperature superconductor material, including the weak link region 13. SFFT 11 may be manufactured from films comprised of TlCaBaCuO and YBaCuO on substrates of LaAlO$_3$.

Alternating portions of weak link region 13 are etched and reduced in height to form weak link region 13. Typically, each weakened link is at least four or five penetration depths wide, or 2–3 micrometers wide. Further, each weakened link is typically 10 micrometers long and 50–90 nanometers thick. The number of links can effect output resistance of the transistor and gain. Ion implantation is another example of a means for weakening region 13. Those skilled in the art are familiar with alternative superconductive materials as well as alternative means for weakening superconductor material.

An array of superconductor weak link region 13 is more susceptible to the influence of externally applied magnetic fields than normal, unweakened superconductor material. A control line 15 carries a current $I_{Control}$ which controls an output, or terminal, voltage across ports 2 and 3 of SFFT 11. The flow of current $I_{Control}$ through the control line 15 generates a magnetic field. Since a portion 17 of control line 15 is in proximity to weak link region 13, the magnetic field generated by current $I_{Control}$ passes through weak link region 13. A critical value of $I_{Control}$ exists such that when SFFT 11 is biased below the critical value, no flux is admitted to weak link region 13. The critical value is often 0.5–5.0 milliamps. When $I_{Control}$ is above the critical value, the magnetic field generated by $I_{Control}$ induces vortices in weak link region 13 such that current $I_{body}$ between ports 2 and 3 is impeded through region 13. Vortices are circular electric currents generated by magnetic fields which tend to impede the flow of electrons, i.e., form regions of resistance. As those skilled in the art will readily appreciate, the magnitude of the resistance will depend upon the magnitude of the magnetic field permeating the weak link as well as the grain size and/or composition of the superconducting material used. The relation between resistance and magnetic field is disclosed in such articles as "The Universal Magnetic Field Dependence of the Critical Current Density in High-$T_c$ Ceramics," by Fisher et al; and "Properties of Critical Current Density in Heterostructures of $Y_1Ba_2Cu_3O_{7-y}/Y_1Ba_2(Cu_{1-x}Ni_x)_3O_{7-y}$Superconducting Films", both in *AIP Conference Proceedings* 251, *Superconductivity and Its Applications*, American Institute of Physics, 1992, incorporated herein by reference. Briefly though, the local critical current density will be directly effected by changes in the magnitude of a magnetic field in which superconducting material is immersed. This direct change is not a linear relationship, however, but rather varies as the relationship, $B^{-3/2}$, wherein B is equal to the magnetic field. By controlling the resistance of the superconducting weak links 13, the output power of the superconducting signal line 15 may also be controlled. Accordingly, in a conventional SFFT 11 magnetic flux through weak link region 13 varies with respect to the magnitude of current $I_{Control}$ in control line 15 so that $I_{Control}$ must be increased in order to increase the magnetic flux through weak link region 13.

Figure 2:
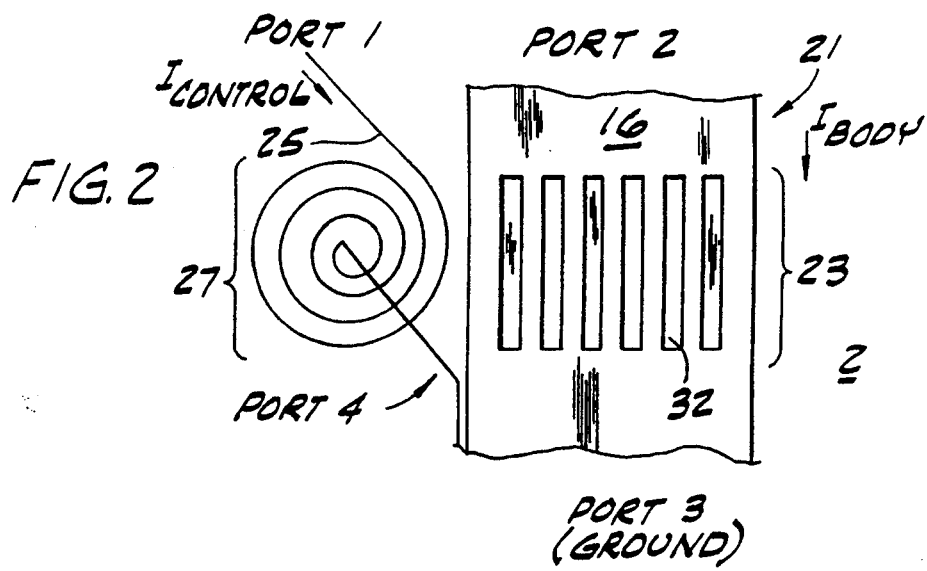
FIG. 2 is an enlarged and fragmentary plan view of a superconducting flux flow transistor having a preferred control line forming a spiral current path according to the present invention.
Figure 3:
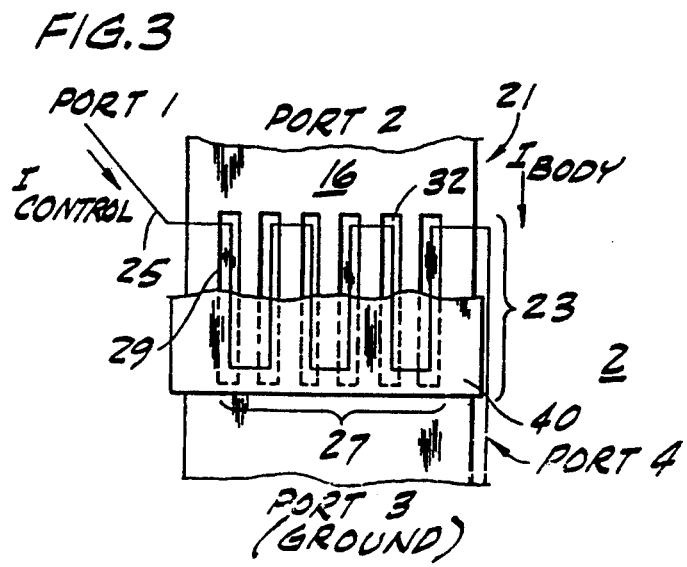
FIG. 3 is an enlarged and fragmentary plan view of a superconducting flux flow transistor having a preferred control line forming a back and forth current path according to the present invention.

FIGS. 2 and 3 show a superconducting flux flow transistor (SFFT) 21 in accordance with preferred embodiments of the present invention. A magnetic field controls operation of the SFFT 21 as it does with SFFT 11. SFFT 21 also has four terminals, ports 1–4, wherein ports 3 and 4 are commonly connected to ground. A region 23 of weakened superconductor, also referred to as a "weak link" region, impedes current $I_{body}$ between ports 2 and 3. Ports 2 and 3 constitute a pair of superconducting electrodes providing a voltage output in the form of a potential difference therebetween. Since a variable resistance is created in weak link 23, a potential difference between port 2 and ports 1, 3 and 4 is created as current $I_{body}$ flows through the region.

As depicted in FIGS. 2 and 3, a superconducting signal line 16 is disposed on a substrate (depicted as the numeral 2). Preferably, the high temperature superconducting material used in the present invention is a specie of $YBa_2Cu_3O_{7-x}$(YBCO) and the substrate 2 is formed of $LaAlO_3$ and is typically on the order of 20 mils thick. The YBCO may be deposited on the substrate using processes known in the art. Typically, two such processes that are used include: an ex-situ process in which Y, Ba, and Cu are deposited with the correct stoichiometry by coevaporation of $BaF_2$, Y and Cu followed by a post deposition annealing, typically at 850° C., in flowing $O_2$ containing water vapor; and an in-situ growth process using off-axis single target sputtering with temperatures typically between 650° and 750° C. As those skilled in the art will readily recognize, other superconducting materials and substrates may also be utilized for this invention. Examples of some other high temperature superconducting materials include $Tl_2Ba_2Ca_2Cu_3O_x$, $Bi_{2-x}Pb_xSr_2Ca_2Cu_3O_{10+y}$, and $Li_xBi_2Sr_2CaCu_2O_{8+y}$ and other substrate materials include $SrTiO_3$ as well as various other metallic substrates.

As shown, superconducting weak links region 23 are then etched in the superconducting signal line 16 as depicted. The patterning of the superconducting weak links region 23 may be accomplished with standard photoresists and known masking techniques. A stray etch may also be used to prevent the formation of a residual film typically found with most other wet etch methods. An example of the dimensions of the patterning of the weak links would $3 \times 10$ microns for the width and length of material to be etched completely down to the substrate (depicted as numeral 2) and the thickness of the existing superconducting material in the weak link region would be reduced to approximately 100 nanometers. This thinning of the weak links permits operation of the invention in a critical current mode. As shown, there preferably are a plurality of such weak links across the width of the superconducting signal line 16. An example width of the signal line 16 would be 1 mil.

In a preferred embodiment of the invention, SFFT 21 has a greater terminal voltage relative to SFFT 11 without having a corresponding increase in current $I_{Control}$. In other words, the gain of SFFT 21 is improved over the gain of SFFT 1. The portion 27 of control line 25 proximate weak link region 23 provides a localized magnetic field through weak link region 23 as a function of $I_{Control}$. The magnetic flux through weak link region 23 induces vortices therein which have a resistance $r_o$. Proximate portion 27 of control line 25 forms a tortuous current path whereby the magnetic flux through weak link region 23 and, thus, resistance $r_o$, is increased as compared to a non-tortuous current path without increasing $I_{Control}$. A tortuous current path may be a path having a number of twists, turns or bends. In other words, the tortuous current path of the present invention contrasts with the linear or curvilinear paths shown in the prior art. In this manner, SFFT 21 has a greater terminal voltage across ports 2 and 3 than conventional SFFT 11 with the same control current $I_{Control}$.

In particular, FIG. 2 shows SFFT 21 having control line 25 configured to have a tortuous current path in the form of a spiral current path. The spiral configuration of control line 25 increases the magnetic field generated by current flow in control line 25 per unit current through weak link region 23. Thus, relative to the field generated by current flow in control line 15 of FIG. 1., the spiral configuration increases the flux generated per unit current which translates into greater gain for SFFT 21.

Alternatively, FIG. 3 shows control line 25 having a tortuous current path in the form of a back and forth current path, or meander line. Current flow in such a back and forth current path is in opposite directions relative to a point located external to control line 25. Proximate portion 27 of control line 25 forms a back and forth current path proximate the weakened links of weak link region 23 in this embodiment of the invention. Such a configuration likewise increases the flux through weak link region 23 per unit current as compared to a non-tortuous current path. Thus, the embodiment of FIG. 3 increases the terminal voltage across ports 2 and 3 without increasing control line current $I_{Control}$.

Preferably, the meandering configuration of control line 25 shown in FIG. 3 includes portions, such as a portion 29, displaced and printed on a semi-insulating or insulating substrate 40 overlaying the weakened links of weak link region 23. This embodiment may include several portions similar to the portion 29 depending on the number of links in weak link region 23. The meandering configuration also includes portions, such as a portion 31, transverse to the normal links of weak link region 23. Again, the number of portions similar to the portion 31 may vary. As shown in FIG. 3, portion 29 may be positioned parallel to the direction of current $I_{body}$ flowing in the weakened 31 links within the gaps 32 which are between the narrow strips of superconductor that constitute weak link region 23. In accordance with preferred embodiments of the invention, control line 25 is nearer to weak link region 23 so that the magnetic field through weak link region 23 is greater relative to control line 15 of FIG. 1 for a given amount of current $I_{Control}$.

As shown in FIGS. 2 and 3, control line 25 generates a greater amount of magnetic flux which passes through weak link region 23 relative to conventional SFFT 11 of FIG. 1 for a given amount of control line current $I_{Control}$. By increasing efficiency thusly, higher gain for SFFT 21 is available. Improved SFFT 21 has an current-voltage characteristic curve similar to that of conventional SFFT 11 except that $I_{body}$ changes more rapidly for a given change in control line current $I_{Control}$. The greater the change in $I_{body}$ for a given change in $I_{Control}$, the greater the gain.

It is to be understood that various alternative configurations of control line 25 may be used to generate a greater amount of magnetic flux through weak link region 23. For example, the spiral configuration of control line 25 may be configured as a solenoid. In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A superconducting flux flow transistor (SFFT) comprising:
    a substrate;
    a superconducting electrode deposited on the substrate providing a voltage output, the superconducting electrode having a region of weakened superconductor and carrying a current $I_{body}$; and
    a control line carrying a current $I_{Control}$ and having a portion thereof displaced in proximity to the weakened region for providing a localized magnetic field through the weakened region, said magnetic field being a function of $I_{Control}$ wherein the magnetic flux through the weakened region induces vortices in the weakened region creating a resistance $r_o$, said proximate portion of the control line forming a tortuous current path whereby the magnetic flux through the weakened region is increased which increases $r_o$ in the weakened region thereby increasing the output voltage of the SFFT wherein the proximate portion of the control line forms a spiral current path.

2. The SFFT of claim 1 wherein the weakened region comprises an array of superconductor links etched within the superconductor electrode.

3. The SFFT of claim 2 further comprising a semi-insulating layer displaced between the control line and superconductor electrode and wherein the proximate portion of the control line is a meander line overlaying the weakened links.

4. The SFFT of claim 3 wherein the meander line includes portions parallel to the direction of current $I_{body}$ flowing in the weakened links and portions transverse to the direction of current flowing in the superconductor electrode.

* * * * *